(12) United States Patent
Drazic et al.

(10) Patent No.: US 10,489,933 B2
(45) Date of Patent: Nov. 26, 2019

(54) METHOD FOR MODELLING AN IMAGE DEVICE, CORRESPONDING COMPUTER PROGRAM PRODUCT AND COMPUTER-READABLE CARRIER MEDIUM

(71) Applicant: THOMSON Licensing, Issy-les-Moulineaux (FR)

(72) Inventors: Valter Drazic, Betton (FR); Laurent Blonde, Thorigné-Fouillard (FR); Paul Kerbiriou, Thorigne-Fouillard (FR); Olivier Bureller, Cesson Sevigne (FR); Guillaume Boisson, Pleumeleuc (FR)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 195 days.

(21) Appl. No.: 15/809,627

(22) Filed: Nov. 10, 2017

(65) Prior Publication Data

US 2018/0150975 A1 May 31, 2018

(30) Foreign Application Priority Data

Nov. 28, 2016 (EP) .................................... 16306565

(51) Int. Cl.
*G06K 9/00* (2006.01)
*G06T 7/80* (2017.01)
(Continued)

(52) U.S. Cl.
CPC ............ *G06T 7/80* (2017.01); *G02B 27/0012* (2013.01); *G06F 17/5009* (2013.01); *G06T 7/50* (2017.01); *G06T 2207/10028* (2013.01)

(58) Field of Classification Search
None
See application file for complete search history.

(56) References Cited

U.S. PATENT DOCUMENTS 5,075,561 A * 12/1991 Rioux .................... G01B 11/24
250/201.8
5,661,667 A * 8/1997 Rueb .................... G01B 11/002
348/202

(Continued)

OTHER PUBLICATIONS

Kumar et al., "On the Equivalence of Moving Entrance Pupil and Radial Distortion for Camera Calibration", 2015 IEEE International Conference on Computer Vision, Santiago, Chile, Dec. 7, 2015, pp. 2345-2353.

(Continued)

*Primary Examiner* — Shervin K Nakhjavan
(74) *Attorney, Agent, or Firm* — Brian J. Dorini; Patricia A. Verlangieri

(57) ABSTRACT

A method for modelling an imaging device including an image sensor and an optical system is disclosed. The optical system has an aperture iris diaphragm defining an entrance pupil of the optical system. For a given configuration of the imaging device the method includes estimating a set of characteristic intrinsic parameters of the imaging device, in which a first intrinsic parameter is representative of a distance between the image plane and a sensor conjugated plane conjugated to the image sensor with respect to the optical system; a second intrinsic parameter is representative of a distance between the sensor conjugated plane and the entrance pupil and a third intrinsic parameter is representative of a magnification of the optical system; determining first and second modelling data respectively as a function of the first and third intrinsic parameters and second and third intrinsic parameters; and establishing a model of the imaging device as a function of the second and third modelling data.

17 Claims, 3 Drawing Sheets

(51) Int. Cl.
*G06T 7/50* (2017.01)
*G02B 27/00* (2006.01)
*G06F 17/50* (2006.01)

(56) References Cited

U.S. PATENT DOCUMENTS

| | | | | |
|---|---|---|---|---|
| 7,612,870 B2* | 11/2009 | Graff | ............ | G01B 11/24 |
| | | | | 356/3.13 |
| 8,472,032 B2* | 6/2013 | Gharib | ............ | G01B 11/2509 |
| | | | | 356/601 |
| 9,530,213 B2* | 12/2016 | Gharib | ............ | G02B 3/0056 |
| 2006/0210117 A1* | 9/2006 | Chang | ............ | G06K 9/00624 |
| | | | | 382/113 |
| 2007/0104353 A1* | 5/2007 | Vogel | ............ | G01C 1/04 |
| | | | | 382/106 |
| 2011/0285696 A1* | 11/2011 | Ocali | ............ | G06T 1/00 |
| | | | | 345/419 |
| 2017/0094251 A1* | 3/2017 | Wolke | ............ | H04N 13/246 |

OTHER PUBLICATIONS

Aggarwal et al., "A Pupil-Centric Model of Image Formation", International Journal of Computer Vision, vol. 48, No. 3, Jan. 2002, pp. 195-214.
Kumar et al., "Generalized Pupil-Centric Imaging and Analytical Calibration for a Non-frontal Camera", 2014 IEEE Conference on Computer Vision and Pattern Recognition (CVPR), Columbus, Ohio, USA, Jun. 23, 2014, pp. 3970-3977.
Chen et al., "Generalized free-space diffuse photon transport model based on the influence analysis of a camera lens diaphragm", Applied Optics, vol. 49, No. 29, Oct. 10, 2010, pp. 5654-5664.
Aggarwal et al., "A New Imaging Model", Eighth IEEE International Conference on Computer Vision, ICCV 2001, Vancouver, British Columbia, Canada, Jul. 7, 2001, pp. 82-89.
Martins et al., "Camera Models Based on Data from Two Calibration Planes", Computer Graphics and Image Processing, vol. 17, No. 2, Oct. 1981, pp. 173-180.

\* cited by examiner

METHOD FOR MODELLING AN IMAGE DEVICE, CORRESPONDING COMPUTER PROGRAM PRODUCT AND COMPUTER-READABLE CARRIER MEDIUM

1. REFERENCE TO RELATED EUROPEAN APPLICATION

This application claims priority from European Patent Application No. 16306565.9, entitled "METHOD FOR MODELLING AN IMAGING DEVICE, CORRESPONDING COMPUTER PROGRAM PRODUCT AND COMPUTER-READABLE CARRIER MEDIUM", filed on Nov. 28, 2016, the contents of which are hereby incorporated by reference in its entirety.

2. TECHNICAL FIELD

The present disclosure pertains to imaging device modelling.

The present disclosure relates to a method for modelling an imaging device, notably but not exclusively, intended to dimensional measurement applications and tridimensional rendering.

For the purposes of this disclosure, "imaging device" or "camera" shall mean an optical imaging system comprising an image sensor and an optical system which is used to form an image of a scene onto the photosensor.

3. BACKGROUND

The present section is intended to introduce the reader to various aspects of art, which may be related to various aspects of the present principles that are described and/or claimed below. This discussion is believed to be helpful in providing the reader with background information to facilitate a better understanding of the various aspects of the present principles. Accordingly, it should be understood that these statements are to be read in this light, and not as admissions of prior art.

In recent decades, there is an important demand for three-dimensional ("3D") content for computer graphics and virtual reality applications. Image-based 3D reconstruction is a technique which makes it possible to obtain a 3D representation of a real object or a real scene (i.e. a 3D model) from a set of images acquired from different points of view of the real object or the real scene. More generally, the aim is to determine, from the set of images, the two-dimensional ("2D") coordinates of visible points on these images in a 3D real space referential.

Because a conventional image capture device acquires images which are projections from 3D scene onto a 2D plane (image sensor), depth information is lost during the acquisition process. A 3D point corresponding to a given image point is constrained to be on the line of sight. From a single image, it is therefore impossible to determine which point on this line corresponds to the image point. If two images acquired from different points of view are available, then the position of a 3D point can be found as the intersection of the two projection rays. Therefore, to obtain a 3D representation, a stereoscopic imaging equipment is usually used, such as a pair of digital cameras for example.

The creation of 3D representation of a scene from multiple images ("backward projection process") is the reverse process of obtaining 2D images from real scene ("forward projection process"). There is therefore a need to understand how the 3D scene is mapped into 2D image for each of the cameras in order to infer 3D representation of the scene from the 2D images acquired by these cameras. This is why a precise description of image formation process for each camera is needed. This is referred to as camera calibration.

Camera calibration consists of determining the relation between the 3D coordinates of 3D points of the scene and the 2D coordinates of their projection in the image (referred to as images points). This is the starting point of the image-based 3D reconstruction process. Camera calibration is an important step to obtain, from acquired images, precise metric information, especially for dimensional measurement applications. Indeed, the optical system of the camera (also commonly referred to as "main lens") is a complex multi-lens system based on a particular arrangement of optical lenses, and it is necessary to take into account defaults (e.g. geometrical distortions) induced by this optical system.

In order to model the process of formation of images of a camera, different known calibration models have been proposed. Among these models, there are the pinhole model (also called central projection model), thin lens model and thick lens model.

Perform a calibration using pinhole model consists in estimating the transformation for making the transition from 3D coordinates of point $P(x_{3d}, y_{3d}, z_{3d})$ of the scene in the object referential to 2D coordinates of the image $I(x_{2d}, y_{2d})$ associated with this point expressed in the image referential. This transformation can be expressed in the form of a multi-dimensional matrix, which comprises the parameters of the model.

The calibration model of the camera is defined by the characteristic intrinsic parameters of the camera. For dimensional measurement applications, it may be also necessary to know extrinsic parameters, i.e. the camera position and orientation in an object coordinate system.

However, pinhole model is based on a virtual location of image sensor plane. So, the backward projection process to remap an object point cloud from an acquired image requires acknowledgment of the distance between the object plane and the virtual image sensor plane. This model cannot respect the imaging system geometry (geometry of the sensor-lens-object triplets), making the backward projection process unreliable.

Another known calibration model using a set of seven intrinsic parameters has been proposed to improve the model accuracy. This known calibration model takes into account the location of entrance and exit pupils associated with the aperture iris diaphragm of the camera (also commonly referred to as "aperture stop"). In a general manner, the aperture iris diaphragm limits the size of the light bundle through the optical system. The pupil is the conjugate of the aperture iris diaphragm of the optical system. It corresponds to the surface, limited by the aperture iris diaphragm, by which a light bundle passes through the optical system. The pupil is said "entrance pupil" in object space and corresponds to the image of the aperture iris diaphragm through the upstream part of the optical system. The pupil is said "exit pupil" in image space and corresponds to the image of the aperture iris diaphragm through the downstream part of the optical system.

The set of seven parameters needed for that known model is: location of the primary and secondary principal planes of the optical system, location of the entrance and exit pupils, the size of the entrance and exit pupils, and the distance between the secondary principal plane and the image plane. This model requires determining manually a high number of parameters, some of which are difficult to assess precisely (like the location of primary and secondary principal planes). This kind of model is complex to implement in practice regardless of the optical formula of the optical system.

There is therefore a need for enhancing the modelling process of an imaging device.

4. SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A particular embodiment of the present principles proposes a method for modelling an imaging device comprising an image sensor and an optical system, the image sensor being disposed in an image plane of the optical system, the optical system comprising an aperture iris diaphragm defining an entrance pupil of the optical system, the method comprising the following steps, for a given configuration of said imaging device:
    estimating a set of characteristic intrinsic parameters of said imaging device, comprising:
        a first intrinsic parameter representative of a distance between said image plane and a sensor conjugated plane conjugated to the image sensor with respect to the optical system;
        a second intrinsic parameter representative of a distance between said sensor conjugated plane and the entrance pupil;
        a third intrinsic parameter representative of a magnification of said optical system;
    determining first modelling data as a function of said first and third intrinsic parameters;
    determining second modelling data as a function of said second and third intrinsic parameters;
    establishing a model of the imaging device as a function of said second and third modelling data.

Thus, this particular embodiment provides a simple and accurate method for modelling an imaging device. The method relies on an astute approach taking into account of limited number of characteristic intrinsic parameters of the imaging device, making model establishment method more easy than prior art method.

According to a particular feature, the first modelling data comprises a first invariant distance defined between said image plane and a first invariant projection point disposed on an optical axis of said imaging device, said first invariant distance satisfying the following formula:

$$P_x = \frac{Z}{|M|+1}$$

with:
Z, the distance between said image plane and said sensor conjugated plane;
M, the magnification of said optical system.

According to a particular feature, the second modelling data is a second invariant distance defined between said image plane and a second invariant projection point located on the optical axis of the imaging device, said second invariant distance satisfying the following formula:

$$P_\alpha = \frac{D}{|M|}$$

with:
D, the distance between said sensor conjugated plane and the entrance pupil;
M, the magnification of optical system.

According to a particular feature, the second intrinsic parameter is estimated by calibration.

According to a particular feature, the second intrinsic parameter is estimated as a function of the first intrinsic parameter and a fourth intrinsic parameter of said set, representative of a distance between said image plane and the entrance pupil.

According to a particular feature, the set of characteristic intrinsic parameters further comprises a fifth intrinsic parameter representative of a position of the optical axis with respect to the image plane.

According to a particular feature, the set of characteristic intrinsic parameters further comprises a sixth parameter representative of a dimension of the entrance pupil.

According to a particular feature, the given configuration of said imaging device comprises a setting belonging to the group comprising: a setting of focus, a setting of distance between a principal plane of the optical system and said image plane.

By abuse of language, the distance between a principal plane of the optical system and the image plane is commonly called "focal distance". But this distance corresponds to the focal distance only when the optical system is focused to infinity.

In another embodiment, the present principles pertain to a computer program product comprising program code instructions for implementing the above-mentioned method (in any of its different embodiments) when said program is executed on a computer or a processor.

In another embodiment, the present principles pertain to a non-transitory computer-readable carrier medium, storing a program which, when executed by a computer or a processor causes the computer or the processor to carry out the above-mentioned method (in any of its different embodiments).

In another embodiment, the present principles pertain to a modelling device for modelling an imaging device comprising a image sensor and a optical system, the image sensor being disposed in an image plane (IP) of the optical system, the optical system comprising an aperture iris diaphragm defining an entrance pupil of the optical system, the device being characterized in that it comprises, for a given configuration of said imaging device:
    estimating unit configured to estimating a set of characteristic intrinsic parameters of said imaging device, comprising:
        a first intrinsic parameter representative of a distance between said image plane and a sensor conjugated plane conjugated to the image sensor with respect to the optical system;

a second intrinsic parameter representative of a distance between said sensor conjugated plane and the entrance pupil;

a third intrinsic parameter representative of a magnification of said optical system;

determining unit configured to determining a first modeling data as a function of said first and third intrinsic parameters;

determining unit configured to determining a second modeling data as a function of said second and third intrinsic parameters;

establishing unit configured to establishing a model of the imaging device as a function of said second and third modelling data.

Advantageously, the device comprises means for implementing the steps performed in the process of modelling as described above, in any of its various embodiments.

In another embodiment, the present principles pertain to an use of a model of an imaging device established according to the method as described above, in any of its various embodiments, for determining metric information of a scene imaged by said imaging device.

5. LIST OF FIGURES

Other features and advantages of embodiments of the present principles shall appear from the following description, given by way of an indicative and non-exhaustive examples and from the appended drawings, of which:

FIG. 1 presents a simplified example of structure of a conventional imaging device;

6. DETAILED DESCRIPTION

Figure 1:
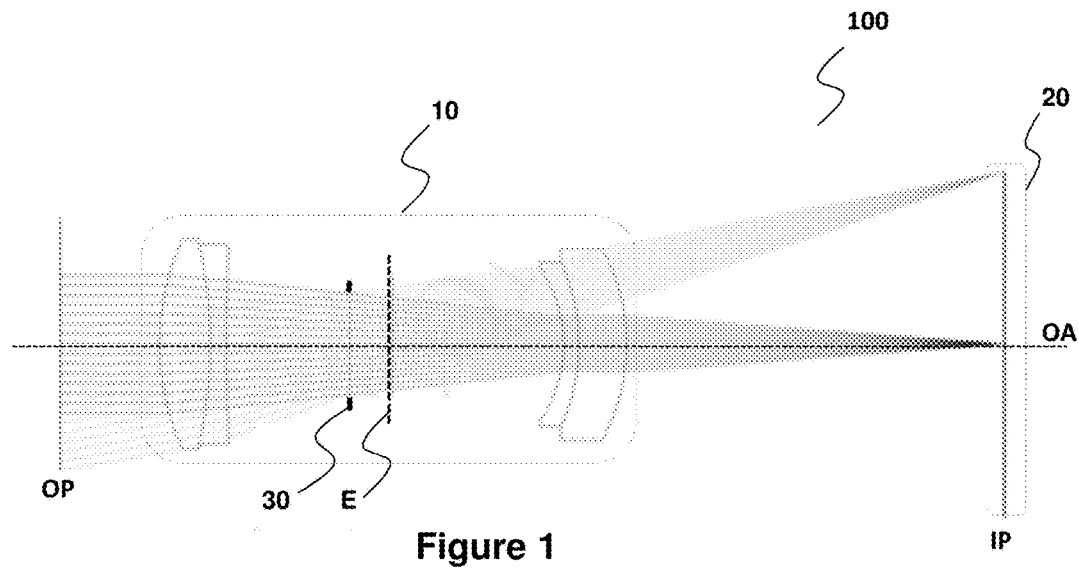

In all of the figures of the present document, identical elements are designated by the same numerical reference sign.

As it will be described more fully hereafter with reference to the accompanying figures, it is proposed in one aspect of the present disclosure to model an imaging device. This disclosure may, however, be embodied in many alternate forms and should not be construed as limited to the embodiments set forth herein. Accordingly, while the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure as defined by the claims. Like numbers refer to like elements throughout the description of the figures.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

While not explicitly described, the present embodiments and variants may be employed in any combination or sub-combination.

Although the present disclosure has been described with reference to one or more examples, workers skilled in the art will recognize that changes may be made in form and detail without departing from the scope of the disclosure and/or the appended claims.

As schematically illustrated in FIG. 1, an imaging device 100 comprises an optical system 10 (also called "main lens") and an image sensor 20.

The image sensor 20 is disposed in an image plane IP of the optical system 10 and uses for example a CCD (Charge-Coupled Device) or CMOS (Complementary Metal Oxide Semiconductor) technology.

The optical system 10 comprises one or more optical lenses disposed according to a particular arrangement along with the optical axis OA of the optical system 10, to form an image of a 3D real scene onto the image sensor 10. Based on the example of FIG. 1, the optical system 10 comprises a set of four lenses. The number of lenses illustrated here is just a non-limitative example for the purposes of pedagogical description. Of course, a smaller or greater number of lenses can be used without departing from the scope of the present principles. Every lens arrangement can also be used without departing from the scope of the present principles.

The optical system 10 further comprises an aperture iris diaphragm 30 defining an entrance pupil EP of the optical system. The plane referred to as OP is an object plane of the optical system 10.

Figure 2:
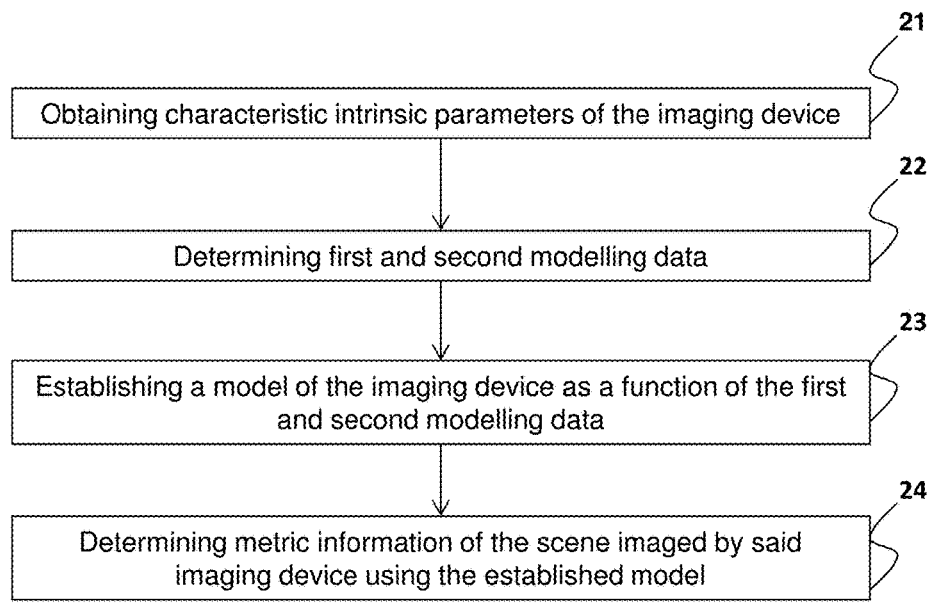
FIG. 2 is a flowchart of a particular embodiment of the modelling method according to the disclosure.

FIG. 2 depicts a method for modelling an imaging device according to a particular embodiment of the disclosure. This method is carried out by a processing unit, the principle of which is described in detail below in relation with FIG. 5.

In this particular embodiment, the method aims at establishing a double invariant point projection model of the imaging device 100. This model is astutely established from a limited number of calibration parameters and respecting geometry of the optical system. This model allows making the relation between the 3D coordinates of points of the scene and the 2D coordinates of their projection onto the image sensor 20 of the imaging device 100 (also referred to as "forward projection process").

For a better understanding of the present principles, the method is described below in relation with FIG. 3, which illustrates a schematic representation of principle of implementation of the method.

Before initiating the method, the imaging device 100 is first set according to a given imaging configuration. This configuration is characterized by a set of settings, such as for example: focus distance, distance between a principal plane of the optical system and the sensor plane (also called "focal distance" by abuse of terms).

At step 21, the processing unit obtains, for said given configuration of the imaging device, the following set of characteristic intrinsic parameters of the imaging device 100:

an intrinsic parameter representative of the distance between the image plane IP and the sensor-conjugated plane CP (hereinafter referred to as "Z");

an intrinsic parameter representative of the distance between the sensor-conjugated plane CP and the entrance pupil EP (hereinafter referred to as "D");

an intrinsic parameter representative of magnification of the optical system 10 (hereinafter referred to as "M").

The sensor-conjugated plane CP discussed above is the plan conjugated to the image sensor 20 with respect to the optical system 10.

The distance parameter D is estimated by a usual calibration technique, for example based on an acquisition of images of a calibration chart (having a chessboard pattern for example) disposed in different positions.

The magnification parameter M is estimated by a usual calibration technique, for example based on an acquisition of images of a reference object of known dimensions. Magnification is by definition the ratio between a dimension of an object and the image of that object through the optical system 10.

The distance parameter Z is measured by telemetry. As an alternative, the distance parameter Z can be estimated using the following formula:

$$Z = D + E$$

with:
D, the distance intrinsic parameter representative of the distance between the sensor conjugated plane CP and the entrance pupil EP;
E, an intrinsic parameter representative of the distance between the image plane IP and the entrance pupil EP (which is estimated by a usual calibration technique).

This set of intrinsic parameters (Z, D, M and possibly E) thus obtained is therefore associated with said given configuration.

According to a first particular embodiment, the imaging device 100 is itself configured to comprise means for acquiring the set of intrinsic parameters, which are then automatically provided to the processing unit by a wired or wireless transmission means.

According to a second particular embodiment, after being acquired by calibration, this is the user who provided manually the set of intrinsic parameters to the processing unit, for example by means of a man/machine interface.

At step 22, the processing unit uses the intrinsic parameters obtained at step 21 to determine first and second modelling data.

First Modelling Data

The device determines a first invariant distance to the image plane IP (hereinafter referred to as $P_x$) on the basis of the following formula:

$$P_x = \frac{Z}{|M| + 1}$$

with:
Z, the distance between the image plane IP and the sensor conjugated plane CP;
M, the magnification of the optical system 10.

This first invariant distance $P_x$ is comprised between the image plane IP and a first characteristic point $p_x$ disposed on the optical axis OA of the imaging device, called "first invariant projection point". The first invariant distance $P_x$ is determine to know the position of the first invariant projection point $p_x$ with respect to the image plane IP (sensor plane).

Second Modelling Data

The device determines a second projection distance to the image plane IP (hereinafter referred to as $P_\alpha$) on the basis of the following formula:

$$P_\alpha = \frac{D}{|M|}$$

with:
D, the distance between the sensor conjugated plane CP and the entrance pupil EP;
M, the magnification of the optical system 10.

This second invariant distance $P_\alpha$ is comprised between the image plane IP and a second characteristic point $p_\alpha$ disposed on the optical axis OA of the imaging device, called "second invariant projection point". The second invariant distance $P_\alpha$ is determined to know the position of the second invariant projection point $p_\alpha$ with respect to the image plane IP (sensor plane).

It should be noted that the processing unit determines either simultaneously or sequentially the first and second invariant distances.

At step 23, the processing unit establishes a model of the imaging device 100 as a function of the first and second invariant distances. This model allows establishing the correspondence between an object point of the scene and the associated image point projected on the image sensor through the imaging device 100 and for said given configuration thereof.

Figure 3:
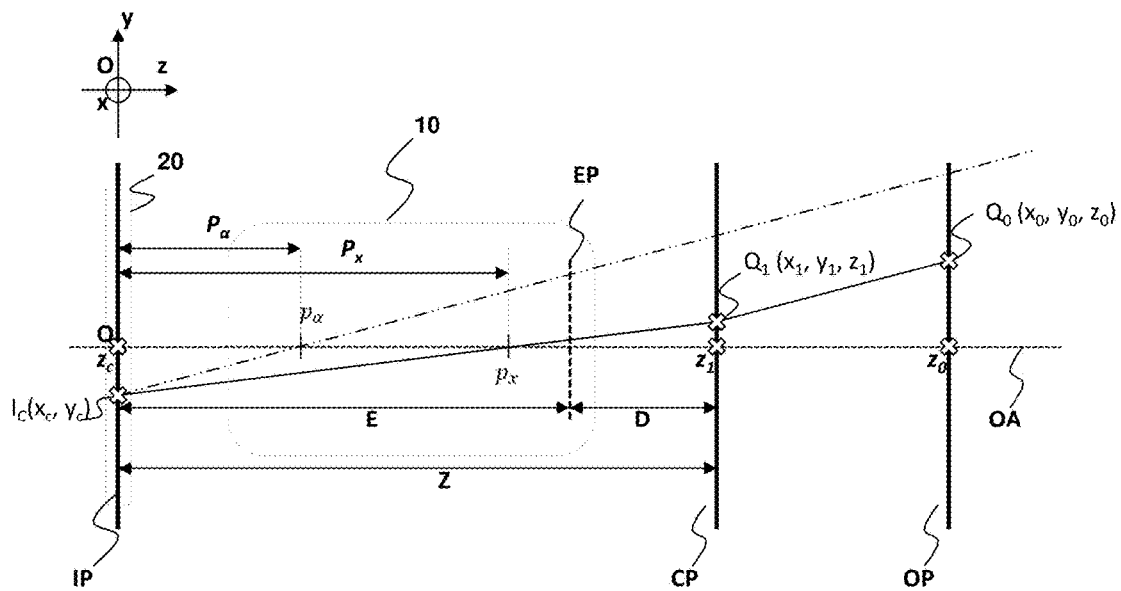
FIG. 3 is a simplified schematic representation illustrating the principle of establishment of a projection model of an imaging device according to a particular embodiment of the disclosure.

In order to locate and reference the different elements of the model in space, let's set the imaging device 100 in a coordinate system (O; x, y, z) as illustrated on FIG. 3. The center O is placed at the intersection of the optical axis OA and the image plane IP.

Let us put it in the context of a projection of an object point $Q_0$ disposed in the plan OP to form a image point $I_0$ onto the image plan IP (forward projection process). The coordinates of an object point $Q_0$ are $(x_0, y_0, z_0)$ and the coordinates of an image point $I_c$ in the image plane IP are $(x_c, y_c, z_c)$.

To simplify demonstration, the image plane IP is set at $z_c=0$. Thus, the image plan IP is placed at $z=z_c=0$, the object plane OP is placed at $z=z_0$ and the sensor conjugated plane CP is placed at $z=z_1$. The object plane OP is arbitrarily set somewhere at $z=z_0$ because depth information is lost during the forward projection process. As well, the first invariant point is placed at $z=P_x$ (which is equal to $P_x$ because $z_c=0$) and the second invariant point is placed at $z=p_\alpha$ (which is equal to $P_\alpha$ because $z_c=0$). The first and second invariant points are now referenced in the coordinate system (O; x, y, z).

In order to reconstruct the light-field in the object space, let's give the example of reconstruction of a ray coming from the object point $Q_0$ of $(x_0, y_0, z_0)$ that hits the image plane IP at the point image $I_c$ of position $(x_c, y_c)$ (back projection process). This reconstruction is performed in two phases, the first phase which involves the first invariant projection point $p_x$ and the second phase which involves the second invariant projection point $p_\alpha$.

For the first phase, the ray (represented by full line in FIG. 3) passing through the image point $I_c(x_c, y_c)$ and the first invariant projection point $p_x$, intersects the sensor conjugated plane CP at the point $Q_1$ at the coordinates $(x_1, y_1, z_1)$. This first phase can be expressed with thin following formula:

$$\begin{pmatrix} x_1 \\ y_1 \end{pmatrix} = -\frac{z_1 - p_x}{p_x} \times \begin{pmatrix} x_c \\ y_c \end{pmatrix} \quad (1)$$

Then, for the second phase, the ray passing through the point $Q_1$ and having a direction identical to the direction of the ray (represented by dotted line in FIG. 3) passing through the image point $I_c(x_c, y_c)$ and the second invariant point $p_\alpha$, intersects the object plane OP at the point $Q_0$ at the coordinates $(x_0, y_0, z_0)$. This second phase can be expressed with the following formula:

$$\begin{pmatrix} x_0 \\ y_0 \end{pmatrix} = \begin{pmatrix} x_1 \\ y_1 \end{pmatrix} - \frac{z_0 - z_1}{p_\alpha} \times \begin{pmatrix} x_c \\ y_c \end{pmatrix} \quad (2)$$

From the above formulas (1) and (2), a backward projection formula can be obtained:

$$\begin{pmatrix} x_0 \\ y_0 \end{pmatrix} = \left[ -\frac{z_0 - z_1}{p_\alpha} - \frac{z_1 - p_x}{p_x} \right] \begin{pmatrix} x_c \\ y_c \end{pmatrix} \quad (3)$$

Of course, this a backward projection formula can be inverted to obtain a forward projection formula:

$$\begin{pmatrix} x_c \\ y_c \end{pmatrix} = \left[ -\frac{z_0 - z_1}{p_\alpha} - \frac{z_1 - p_x}{p_x} \right]^{-1} \begin{pmatrix} x_0 \\ y_0 \end{pmatrix} \quad (4)$$

It should be noted that for the present demonstration, the object plane OP is arbitrarily set somewhere at $z=z_0$ because depth information is lost during the forward projection process.

Thus, as we can see, the projection formula—be it for a backward or forward projection—is as a function of the position of first and second invariant projection points $(p_\alpha, p_x)$ with respect the image plan IP and the position of the sensor conjugated plane CP $(z_1)$ with respect the image plan IP.

Figure 4:
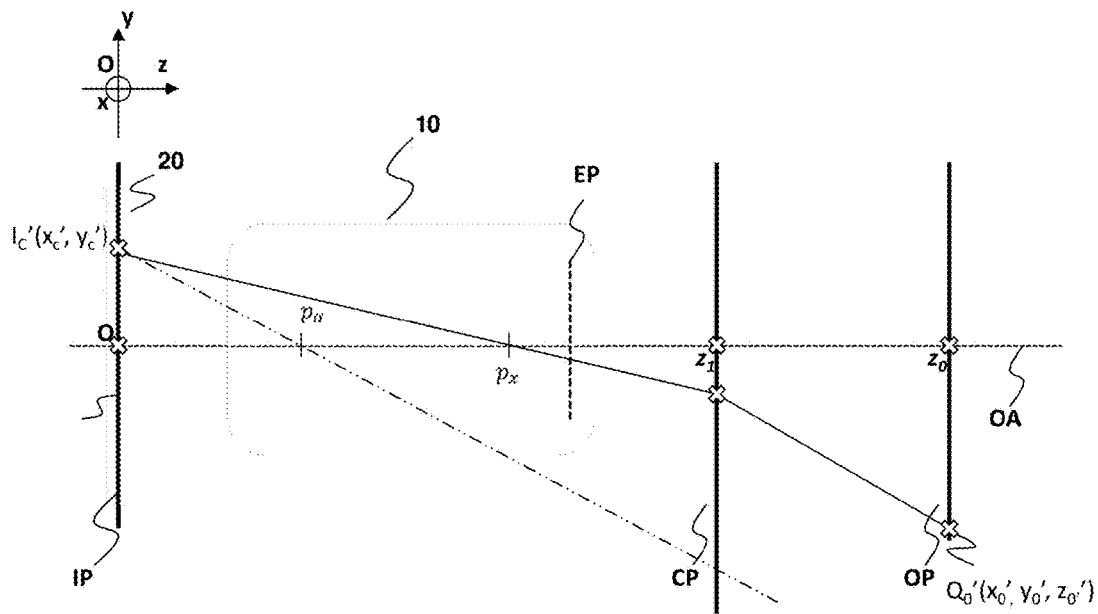
FIG. 4 is a simplified schematic representation illustrating the principle of establishment of a projection model of an imaging device according to another embodiment of the disclosure.

The projection model based on the forward projection formula makes the correspondence between every object point $Q_0(x_0, y_0, z_0)$ and every associated image point $I_c(x_c, y_c)$ on the image sensor 20, thanks to the two invariant points $p_x$ and $p_\alpha$. FIG. 4 shows another example of correspondence between an object point $Q_0'(x_0', y_0', z_0')$ and its associated image point $I_c'(x_c', y_c', z_c')$ using the model of the disclosure.

The forward projection model can then be simply inverted to be used for dimensional measurement applications and tridimensional rendering, as discussed below in relation with step 24.

Eventually it should be noted that if a new imaging configuration of the imaging device 100 is performed (a new value of focus distance and/or a new value of focal distance for example), a new iteration of the steps 21 to 23 described above is needed.

At step 24, the processing unit uses the model established at previous step 23 to determine metric information of the scene. For example, it can be interesting to know the depth of an object of the scene in the coordinate system (O; x, y, z).

Let us put it in the context of stereoscopic imaging equipment based on a pair of digital cameras (C1, C2). Each camera comprises an optical system and an image sensor such as those comprised in the imaging device 100.

The focus is put on determining, for each image point $I_c$ of a given image sensor (for example the image sensor of the camera C1), the corresponding object point at $Q_0$ which has been imaged at the image point $I_c$ $(x_0, y_0, z_0)$.

An image point $I_c$ is hereafter considered to be a pixel or a predefined group of pixels without departing from the scope of the disclosure.

Depth information, which is lost during the acquisition process when one camera is used, can be determined when a pair of cameras is involved.

By using a disparity calculation (by means of a matching algorithm known from prior art for example), it is possible to compute a depth map for each of cameras C1 and C2. This depth map is for example a 2D representation of a 3D scene in which each image point $I_c$ of coordinates $(x_c, y_c)$ is associated with depth information $z_0$. For a given camera (camera C1 for example), depth information $z_0$ can be expressed as follows:

$$z_0 = E \times \frac{b}{d} \quad (5)$$

with:
$z_0$, depth information of an object point of the scene, associated with said image point $I_c$, representative of the distance of this object point with respect to the image plan IP;
$z_1$, the distance between the sensor conjugated plane CP and the image plane IP of said given camera;
b, the distance comprised between the optical centre of the camera C1 and the optical centre of the camera C2 (or between the first invariant point $p_x$ of the camera C1 and the first invariant point $p_x$ of the camera C2);
d, the disparity assessed for said image point $I_c$.

This depth map comprises depth information representative of the distance of object points with respect to the image plan IP. It can be stored as a digital file or table of any format.

At this stage, the processing unit has, for each camera, the projection model based on the backward projection formula (established as function of characteristic intrinsic parameters of said camera as explained above), as well as a depth map associated with said camera. The processing unit is therefore able, for each image point $I_c$ $(x_c, y_c)$ of sensor of said camera and its associated depth information $z_0$, to determine the corresponding point in the scene object point $Q_0$ by applying the following formula:

$$\begin{pmatrix} x_o \\ y_o \\ z_o \end{pmatrix} = \left( -\frac{z_o - z_1}{p_\alpha} - \frac{z_1 - p_x}{p_x} \right) \begin{pmatrix} x_c \\ y_c \\ 0 \end{pmatrix} + \begin{pmatrix} 0 \\ 0 \\ z_o \end{pmatrix} \quad (6)$$

The processing unit based on the formula can then perform dimensional measurements.

It is therefore possible to determine, from an acquired image, an object point cloud of the scene in the coordinate system with respect to the real position of the image sensor. Thus, contrary to the prior art method according to which an object point cloud is determined with respect to a virtual position of the image sensor (pinhole model), the method according to the disclosure enables to provide an accurate based-image rendering that respects the imaging system geometry (geometry of the sensor-lens-object triplets).

The method therefore relies on an astute approach enabling to take into account of a limited number of characteristic intrinsic parameters of the imaging device, making model establishment method easier than conventional method of prior art.

According to a particular feature, the set of characteristic intrinsic parameters further comprises an additional intrinsic parameter, which is representative of the optical axis position with respect to the image plane. This additional intrinsic parameter is obtained by conventional calibration to provide the position of the optical axis OA with respect to the image plane IP. Indeed the optical axis of the optical system does not necessarily pass through the sensor center. The model can then be established by taking into account this additional intrinsic parameter, for example by means of an offset with respect of the optical center of the image sensor 20 expressed in number of pixels. This particular feature makes the established model even more accurate.

According to another particular feature, the set of characteristic intrinsic parameters further comprises an additional intrinsic parameter, which is representative of a dimension of the entrance pupil E. This additional intrinsic parameter is obtained by conventional calibration, to provide a dimension of the entrance pupil E, such as pupil diameter. The model can then be established by taking into account this additional intrinsic parameter particularly when a light beam representation (instead of a ray representation) is used to establish the model (indeed pupil diameter is the geometric parameter limiting the size of input light beam in the optical system).

Figure 5:
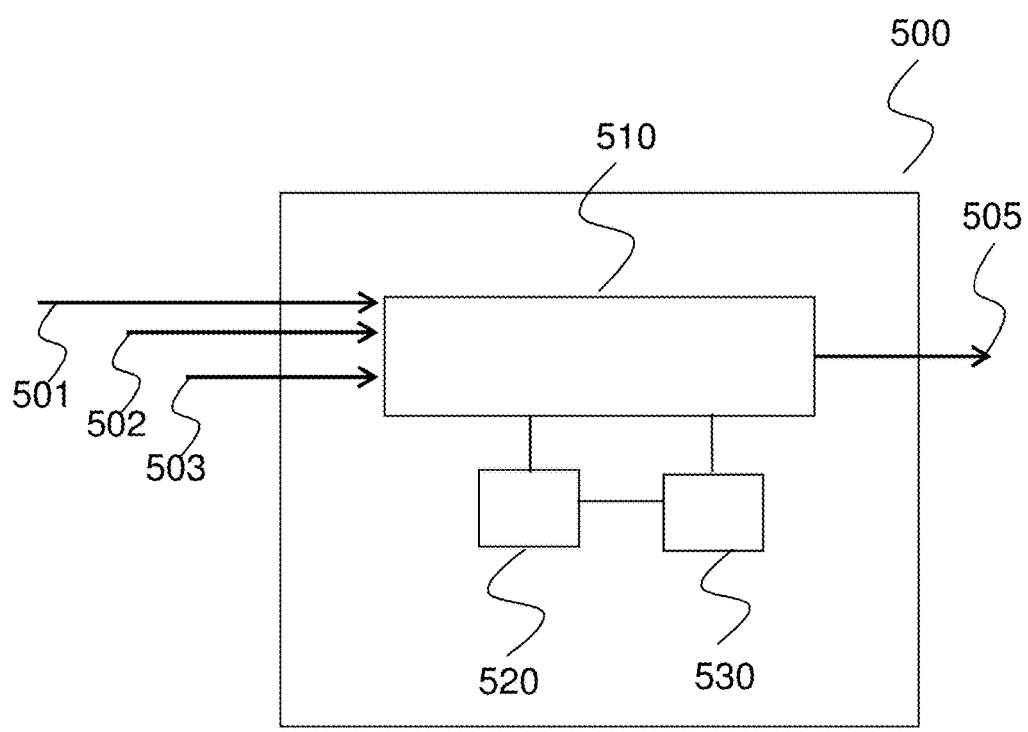
FIG. 5 shows the simplified structure of a processing unit according to a particular embodiment of the disclosure.

FIG. 5 shows the simplified structure of a processing unit (or modelling device) 500 according to a particular embodiment of the disclosure, which carries out the steps 21 to 24 of method shown in FIG. 2.

The processing unit 500 comprises a non-volatile memory 530 is a non-transitory computer-readable carrier medium. It stores executable program code instructions, which are executed by the processor 510 in order to enable implementation of the modified multi-view content obtaining method described above. Upon initialization, the program code instructions are transferred from the non-volatile memory 530 to the volatile memory 520 so as to be executed by the processor 510. The volatile memory 520 likewise includes registers for storing the variables and parameters required for this execution.

According to this particular embodiment, the processing unit 500 receives as inputs characteristic intrinsic parameters of the imaging device (Z distance parameter 501, D distance parameter 502, M magnification parameter 503). The processing unit 500 generates as outputs a double invariant point projection model (505) as described above.

As will be appreciated by one skilled in the art, aspects of the present principles can be embodied as a system, method or computer readable medium. Accordingly, aspects of the present principles can take the form of an entirely hardware embodiment, an entirely software embodiment (including firmware, resident software, micro-code, and so forth), or an embodiment combining software and hardware aspects that can all generally be referred to herein as a "circuit", "module", or "system".

When the present principles are implemented by one or several hardware components, it can be noted that an hardware component comprises a processor that is an integrated circuit such as a central processing unit, and/or a microprocessor, and/or an Application-specific integrated circuit (ASIC), and/or an Application-specific instruction-set processor (ASIP), and/or a graphics processing unit (GPU), and/or a physics processing unit (PPU), and/or a digital signal processor (DSP), and/or an image processor, and/or a coprocessor, and/or a floating-point unit, and/or a network processor, and/or an audio processor, and/or a multi-core processor. Moreover, the hardware component can also comprise a baseband processor (comprising for example memory units, and a firmware) and/or radio electronic circuits (that can comprise antennas) which receive or transmit radio signals. In one embodiment, the hardware component is compliant with one or more standards such as ISO/IEC 18092/ECMA-340, ISO/IEC 21481/ECMA-352, GSMA, StoLPaN, ETSI/SCP (Smart Card Platform), GlobalPlatform (i.e. a secure element). In a variant, the hardware component is a Radio-frequency identification (RFID) tag. In one embodiment, a hardware component comprises circuits that enable Bluetooth communications, and/or Wi-fi communications, and/or Zigbee communications, and/or USB communications and/or Firewire communications and/or NFC (for Near Field) communications.

Furthermore, aspects of the present principles can take the form of a computer readable storage medium. Any combination of one or more computer readable storage medium(s) may be utilized.

A computer readable storage medium can take the form of a computer readable program product embodied in one or more computer readable medium(s) and having computer readable program code embodied thereon that is executable by a computer. A computer readable storage medium as used herein is considered a non-transitory storage medium given the inherent capability to store the information therein as well as the inherent capability to provide retrieval of the information therefrom. A computer readable storage medium can be, for example, but is not limited to, an electronic, magnetic, optical, electromagnetic, infrared, or semiconductor system, apparatus, or device, or any suitable combination of the foregoing. It is to be appreciated that the following, while providing more specific examples of computer readable storage mediums to which the present principles can be applied, is merely an illustrative and not exhaustive listing as is readily appreciated by one of ordinary skill in the art: a portable computer diskette; a hard disk; a read-only memory (ROM); an erasable programmable read-only memory (EPROM or Flash memory); a portable compact disc read-only memory (CD-ROM); an optical storage device; a magnetic storage device; or any suitable combination of the foregoing.

Thus for example, it will be appreciated by those skilled in the art that the block diagrams presented herein represent conceptual views of illustrative system components and/or circuitry embodying the principles of the disclosure. Similarly, it will be appreciated that any flow charts, flow diagrams, state transition diagrams, pseudo code, and the like represent various processes which may be substantially represented in computer readable storage media and so executed by a computer or a processor, whether or not such computer or processor is explicitly shown.

Although the present disclosure has been described with reference to one or more examples, workers skilled in the art will recognize that changes may be made in form and detail without departing from the scope of the disclosure and/or the appended claims.

Naturally, the present disclosure is not limited to the embodiments previously described.

The implementations described herein may be implemented in, for example, a method or a process, an apparatus, a computer program product, a data stream, or a signal. Even if only discussed in the context of a single form of implementation (for example, discussed only as a method or a device), the implementation of features discussed may also be implemented in other forms (for example a program). An apparatus may be implemented in, for example, appropriate hardware, software, and firmware. The methods may be implemented in, for example, an apparatus such as, for example, a processor, which refers to processing devices in general, including, for example, a computer, a microprocessor, an integrated circuit, or a programmable logic device. Processors also include communication devices, such as, for example, Smartphones, tablets, computers, mobile phones, portable/personal digital assistants ("PDAs"), and other devices that facilitate communication of information between end-users.

Implementations of the various processes and features described herein may be embodied in a variety of different equipment or applications, particularly, for example, equipment or applications associated with data encoding, data decoding, view generation, texture processing, and other processing of images and related texture information and/or depth information. Examples of such equipment include an encoder, a decoder, a post-processor processing output from a decoder, a pre-processor providing input to an encoder, a video coder, a video decoder, a video codec, a web server, a set-top box, a laptop, a personal computer, a cell phone, a PDA, and other communication devices. As should be clear, the equipment may be mobile and even installed in a mobile vehicle.

Additionally, the methods may be implemented by instructions being performed by a processor, and such instructions (and/or data values produced by an implementation) may be stored on a processor-readable medium such as, for example, an integrated circuit, a software carrier or other storage device such as, for example, a hard disk, a compact diskette ("CD"), an optical disc (such as, for example, a DVD, often referred to as a digital versatile disc or a digital video disc), a random access memory ("RAM"), or a read-only memory ("ROM"). The instructions may form an application program tangibly embodied on a processor-readable medium. Instructions may be, for example, in hardware, firmware, software, or a combination. Instructions may be found in, for example, an operating system, a separate application, or a combination of the two. A processor may be characterized, therefore, as, for example, both a device configured to carry out a process and a device that includes a processor-readable medium (such as a storage device) having instructions for carrying out a process. Further, a processor-readable medium may store, in addition to or in lieu of instructions, data values produced by an implementation.

As will be evident to one of skill in the art, implementations may produce a variety of signals formatted to carry information that may be, for example, stored or transmitted. The information may include, for example, instructions for performing a method, or data produced by one of the described implementations. For example, a signal may be formatted to carry as data the rules for writing or reading the syntax of a described embodiment, or to carry as data the actual syntax-values written by a described embodiment. Such a signal may be formatted, for example, as an electromagnetic wave (for example, using a radio frequency portion of spectrum) or as a baseband signal. The formatting may include, for example, encoding a data stream and modulating a carrier with the encoded data stream. The information that the signal carries may be, for example, analog or digital information. The signal may be transmitted over a variety of different wired or wireless links, as is known. The signal may be stored on a processor-readable medium.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are contemplated by this application.

The invention claimed is:

1. A method for modelling an imaging device comprising an image sensor and an optical system, the image sensor being disposed in an image plane of the optical system, the optical system comprising an aperture iris diaphragm defining an entrance pupil of the optical system, the method comprising, for a given configuration of said imaging device:
    determining a set of characteristic intrinsic parameters of said imaging device, comprising:
        a first intrinsic parameter representative of a distance between said image plane and a sensor conjugated plane conjugated to the image sensor with respect to the optical system;
        a second intrinsic parameter representative of a distance between said sensor conjugated plane and the entrance pupil;
        a third intrinsic parameter representative of a magnification of said optical system;
    determining first modelling data as a function of said first and third intrinsic parameters;
    determining second modelling data as a function of said second and third intrinsic parameters;
    mapping at least a 3D point with associated at least an image point on said image sensor based on a model of the imaging device obtained as a function of said second and third modelling data.

2. The method according to claim 1, wherein the first modelling data comprises a first invariant distance $P_x$ defined between said image plane and a first invariant projection point ($p_x$) disposed on an optical axis of said imaging device, said first invariant distance $P_x$ satisfying the following formula:

$$P_x = \frac{Z}{|M|+1}$$

with:
    Z, the distance between said image plane and said sensor conjugated plane;
    M, the magnification of said optical system.

3. The method according to claim 2, wherein the set of characteristic intrinsic parameters further comprises a fifth intrinsic parameter representative of a position of the optical axis with respect to the image plane.

4. The method according to claim 1, wherein the second modelling data is a second invariant distance $P_\alpha$ defined between said image plane and a second invariant projection point ($p_\alpha$) located on the optical axis of the imaging device, said second invariant distance $P_\alpha$ satisfying the following formula:

$$P_\alpha = \frac{D}{|M|}$$

with:
D, the distance between said sensor conjugated plane and the entrance pupil;
M, the magnification of optical system.

5. The method according to claim 1, wherein the second intrinsic parameter is estimated by calibration.

6. The method according to claim 1, wherein the second intrinsic parameter is estimated as a function of the first intrinsic parameter and a fourth intrinsic parameter of said set, representative of a distance between said image plane and the entrance pupil.

7. The method according to claim 1, wherein the set of characteristic intrinsic parameters further comprises a sixth parameter representative of a dimension of the entrance pupil.

8. The method according to claim 1, wherein the given configuration of said imaging device comprises a setting belonging to the group comprising: a setting of focus, a setting of distance between a principal plane of the optical system and said image plane.

9. Use of a model of an imaging device established by the method according to claim 1, for determining metric information of a scene imaged by said imaging device.

10. A device for modelling an imaging device comprising an image sensor and an optical system, the image sensor being disposed in an image plane of the optical system, the optical system comprising an aperture iris diaphragm defining an entrance pupil of the optical system, the device comprising, for a given configuration of said imaging device:
estimating unit configured to estimate a set of characteristic intrinsic parameters of said imaging device, comprising:
a first intrinsic parameter representative of a distance between said image plane and a sensor conjugated plane conjugated to the image sensor with respect to the optical system;
a second intrinsic parameter representative of a distance between said sensor conjugated plane and the entrance pupil;
a third intrinsic parameter representative of a magnification of said optical system;
determining unit configured to determine a first modeling data as a function of said first and third intrinsic parameters;
determining unit configured to determine a second modeling data as a function of said second and third intrinsic parameters;
mapping unit configured to map at least a 3D point with associated at least an image point on said image sensor based on a model of the imaging device obtained as a function of said second and third modelling data.

11. The device according to claim 10, wherein the first modelling data comprises a first invariant distance $P_x$ defined between said image plane and a first invariant projection point ($p_x$) disposed on an optical axis of said imaging device, said first invariant distance $P_x$ satisfying the following formula:

$$P_x = \frac{Z}{|M|+1}$$

with:
Z, the distance between said image plane and said sensor conjugated plane;
M, the magnification of said optical system.

12. The device according to claim 11, wherein the set of characteristic intrinsic parameters further comprises a fifth intrinsic parameter representative of a position of the optical axis with respect to the image plane.

13. The device according to claim 10, wherein the second modelling data is a second invariant distance $P_\alpha$ defined between said image plane and a second invariant projection point ($p_\alpha$) located on the optical axis of the imaging device, said second invariant distance $P_\alpha$ satisfying the following formula:

$$P_\alpha = \frac{D}{|M|}$$

with:
D, the distance between said sensor conjugated plane and the entrance pupil;
M, the magnification of optical system.

14. The device according to claim 10, wherein the second intrinsic parameter is estimated by calibration.

15. The device according to claim 10, wherein the second intrinsic parameter is estimated as a function of the first intrinsic parameter and a fourth intrinsic parameter of said set, representative of a distance between said image plane and the entrance pupil.

16. The device according to claim 10, wherein the set of characteristic intrinsic parameters further comprises a sixth parameter representative of a dimension of the entrance pupil.

17. The device according to claim 10, wherein the given configuration of said imaging device comprises a setting belonging to the group comprising: a setting of focus, a setting of distance between a principal plane of the optical system and said image plane.

* * * * *

UNITED STATES PATENT AND TRADEMARK OFFICE
CERTIFICATE OF CORRECTION

Page 1 of 1

PATENT NO. : 10,489,933 B2
APPLICATION NO. : 15/809627
DATED : November 26, 2019
INVENTOR(S) : Valter Drazic et al.

It is certified that error appears in the above-identified patent and that said Letters Patent is hereby corrected as shown below:

On the Title Page

Item (57), In the Abstract, Line 17, replace "second and third modelling" with --first and second modelling--.

In the Specification

Column 3, Line 47, replace "second and third modelling" with --first and second modelling--.

Column 5, Line 13, replace "second and third" with --first and second--.

In the Claims

Column 14, Line 42, replace "associated at least an" with --at least an associated--.

Column 14, Line 45, replace "second and third modelling" with --first and second modelling--.

Column 16, Line 2, replace "associated at least an" with --at least an associated--.

Column 16, Line 4, replace "second and third modelling" with --first and second modelling--.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*